(12) United States Patent
Chen et al.

(10) Patent No.: US 8,846,538 B1
(45) Date of Patent: Sep. 30, 2014

(54) PASSIVE ELEMENTS, ARTICLES, PACKAGES, SEMICONDUCTOR COMPOSITES, AND METHODS OF MANUFACTURING SAME

(75) Inventors: Bomy Chen, Cupertino, CA (US); Long Ching Wang, Cupertino, CA (US); Sychi Fang, Palo Alto, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/560,915

(22) Filed: Jul. 27, 2012

Related U.S. Application Data

(63) Continuation of application No. 12/581,783, filed on Oct. 19, 2009, now Pat. No. 8,258,065, which is a continuation of application No. 11/772,080, filed on Jun. 29, 2007, now Pat. No. 7,605,092.

(51) Int. Cl.
*H01L 21/302* (2006.01)

(52) U.S. Cl.
USPC ........... 438/700; 438/692; 438/780; 438/775; 257/E21.006; 257/E21.007; 257/E21.17; 257/E21.218; 257/E21.229; 257/E21.304; 257/E21.655

(58) Field of Classification Search
USPC ......... 438/700, 692, 780, 775, 712, 782, 683; 257/E21.006, E21.007, E21.17, 257/E21.218, E21.229, E21.304, E21.655
See application file for complete search history.

(56) References Cited

U.S. PATENT DOCUMENTS

| | | | |
|---|---|---|---|
| 6,459,032 B1 | 10/2002 | Luch | |
| 6,582,887 B2 * | 6/2003 | Luch | 430/311 |
| 7,394,425 B2 | 7/2008 | Luch | |
| 7,413,929 B2 | 8/2008 | Lee et al. | |
| 7,605,092 B2 | 10/2009 | Chen | |
| 8,258,065 B2 * | 9/2012 | Chen et al. | 438/780 |

* cited by examiner

*Primary Examiner* — David Nhu
(74) *Attorney, Agent, or Firm* — DLA Piper LLP (US)

(57) ABSTRACT

Systems and methods associated with semiconductor articles are disclosed, including forming a first layer of material on a substrate, etching trenches within regions defining a passive element in the first layer, forming metal regions on sidewalls of the trenches, and forming a region of dielectric or polymer material over or in the substrate. Moreover, an exemplary method may also include forming areas of metal regions on the sidewalls of the trenches such that planar strip portions of the areas form electrically conductive regions of the passive element(s) that are aligned substantially perpendicularly with respect to a primary plane of the substrate. Other exemplary embodiments may comprise various articles or methods including capacitive and/or inductive aspects, Titanium- and/ or Tantalum-based resistive aspects, products, products by processes, packages and composites consistent with one or more aspects of the innovations set forth herein.

46 Claims, 14 Drawing Sheets

SWITCH-CONTROLLED
VARIABLE MM-CAPACITOR

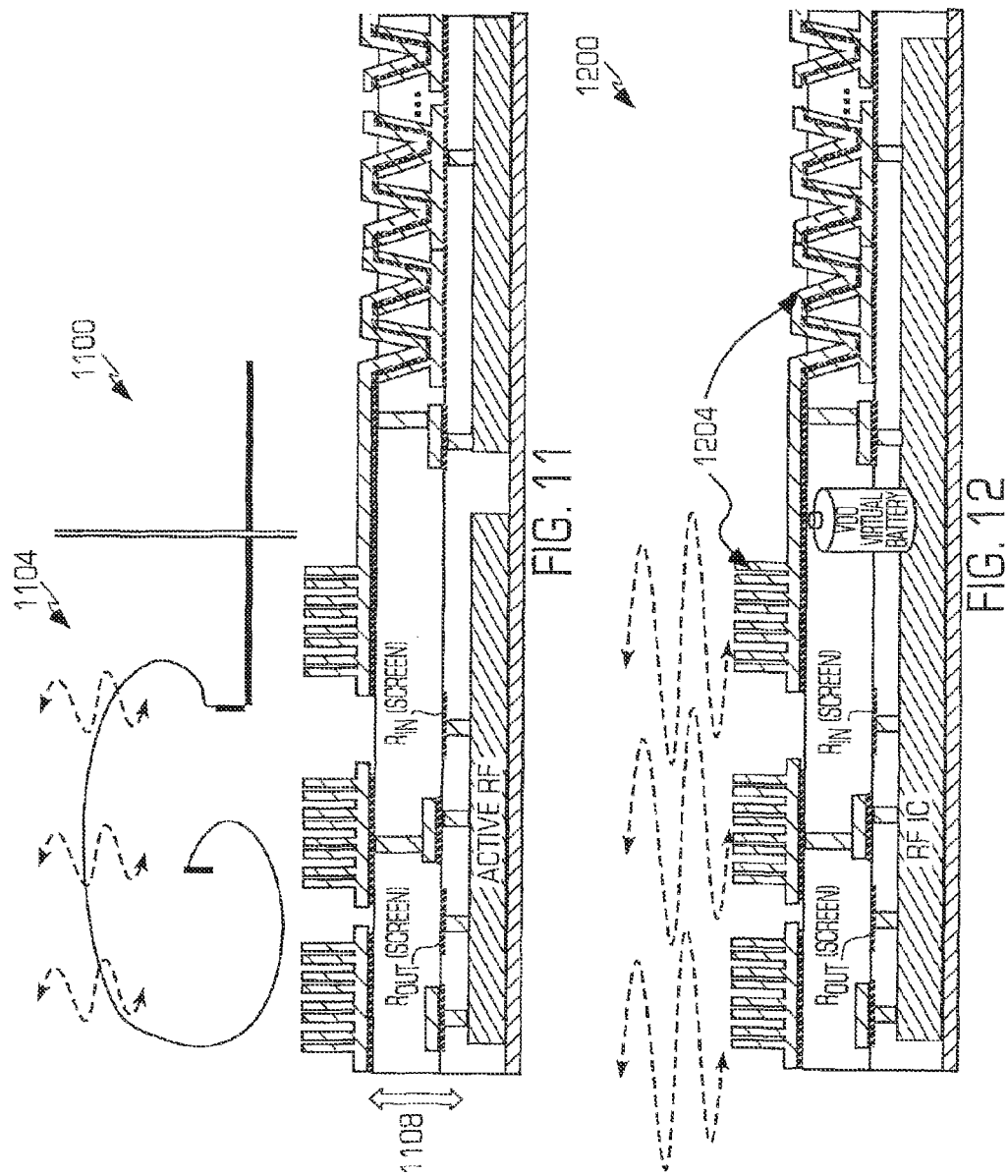

PASSIVE ELEMENTS, ARTICLES, PACKAGES, SEMICONDUCTOR COMPOSITES, AND METHODS OF MANUFACTURING SAME

CROSS-REFERENCE TO RELATED APPLICATION(S)

This is a continuation of application Ser. No. 12/581,783, filed Oct. 19, 2009, published as US2010/0173468A1, now U.S. Pat. No. 8,258,065, which is a continuation of application Ser. No. 11/772,080, filed Jun. 29, 2007, published as US2009/0004807A1, now U.S. Pat. No. 7,605,092, which are incorporated herein by reference in entirety.

BACKGROUND

1. Field

The present invention relates to articles and methods of manufacture in the semiconductor field, and, more particularly, to composites, devices, passive elements, and packages as well as their methods of manufacture.

2. Description of Related Information

Many integrated circuits ("ICs"), particularly in the radio frequency field, include passive circuit elements having the drawback that they occupy excessive surface area of the circuit die. Existing high performance articles (passive circuit elements, devices, ICs, packages, etc.) and methods of making such articles generally do not take into account certain important aspects related to reducing the footprint of these elements. They are unable to implement fabrication and placement techniques that provide passive devices such as inductors, capacitors, and resistors having both high density and optimum operating parameters.

For example, many existing articles and related methods sometimes include inductive elements comprised of wiring layers disposed on an upper layer of a semiconductor substrate. These articles and their associated methods typically implement the inductive elements by means of thick or otherwise expensive films that may also operate inefficiently. Existing articles and methods may also require restricted placement of the inductive elements based on the effects of the current flow within the conductive traces and/or other electromagnetic issues such as interference with the substrate or neighboring structures. Additional drawbacks of these inductive elements include substrate loss, inefficient use of die surface area, and lower density stemming from undesired structural features such as (large) isolation regions, overly thick dielectric layers, etc.

Other existing articles and methods of fabrication are directed to capacitive elements such as metal-insulator-metal ("MIM") capacitors capable of effective operation in some radio frequency applications. However, such elements generally occupy significant surface area and have poor scalability. Accordingly, these existing devices and their fabrication techniques provide ICs with excessive die sizes and high costs.

Furthermore, still other existing articles and methods relate to passive elements, particularly resistors and inductors, including conductive regions having wide traces subject to drawbacks such as high resistance and undesired skin effects. These articles and methods often also fail to achieve other well known objectives associated with such traces, such as the desirability of placing passive elements as close as possible to other circuits/elements, on the IC and/or in packages and articles.

In sum, there is a need for articles and methods that may implement passive circuit elements characterized by high density as well as optimum placement and operation on a substrate, such as, for example, compact inductors, capacitors and resistors of very small form factor, good Q-factor, and/or high self-resonance frequency.

SUMMARY

Systems and methods consistent with the present invention are directed to passive circuit elements, as well as articles and methodologies related thereto, having both high density and optimum operating parameters.

According to aspects consistent with the innovations herein, there is provided a method of manufacturing a semiconductor article including forming a first layer of material on a substrate, etching trenches within regions defining a passive element in the first layer, forming metal regions on sidewalls of the trenches, and forming a region of dielectric or polymer material over the substrate. Moreover, the method may include forming areas of the metal regions on the sidewalls of the trenches such that planar strip portions of the areas form electrically conductive regions of the passive element(s) that are aligned substantially perpendicularly with respect to a primary plane of the substrate.

According to other aspects, there is provided capacitive and/or inductive elements comprised of substrates, a first layer of material formed on the substrate and having trenches therein, metal layers formed on the sidewalls of the trenches forming electrically conductive regions, and regions of dielectric and/or polymer material in the trenches.

According to further aspects, there is provided a method of making Titanium- and/or Tantalum-based resistors including sputtering Titanium or Tantalum in a Nitrogen plasma to form an ambient, performing nitrodation/nitrodization in association with the ambient, and adding a low concentration of oxygen into the ambient.

Additional aspects may also include, inter alia, other methods, products, products by processes, articles, packages and composites consistent with one or more aspects of the innovations set forth herein.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various features and aspects of the present invention and, together with the description, explain the principles of the invention. In the drawings:

FIG. 11 illustrates top and side views of another exemplary module or package consistent with certain aspects related to the present invention;

FIG. 12 illustrates another exemplary module or package consistent with certain aspects related to the present invention;

DETAILED DESCRIPTION

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

Exemplary structures in the semiconductor fields and associated methods of manufacture consistent with the present invention are illustrated in FIGS. 1A-14, which show processing steps related to formation of the semiconductor articles of the present invention as well as the articles themselves. The method may begin with a semiconductor or related substrate 100, which may be of P type and is well known in the art. The thickness of the layers described below will depend upon the design rules and the process technology generation. The exemplary aspects described below relate to 0.5-0.13 um micron processes. However, it will be understood by those skilled in the art that the present invention is not limited to any specific process technology generation, nor to any specific value in any of the process parameters described hereinafter.

Initial Trench and Conductive Element/Fin Formation

Figure 1A:
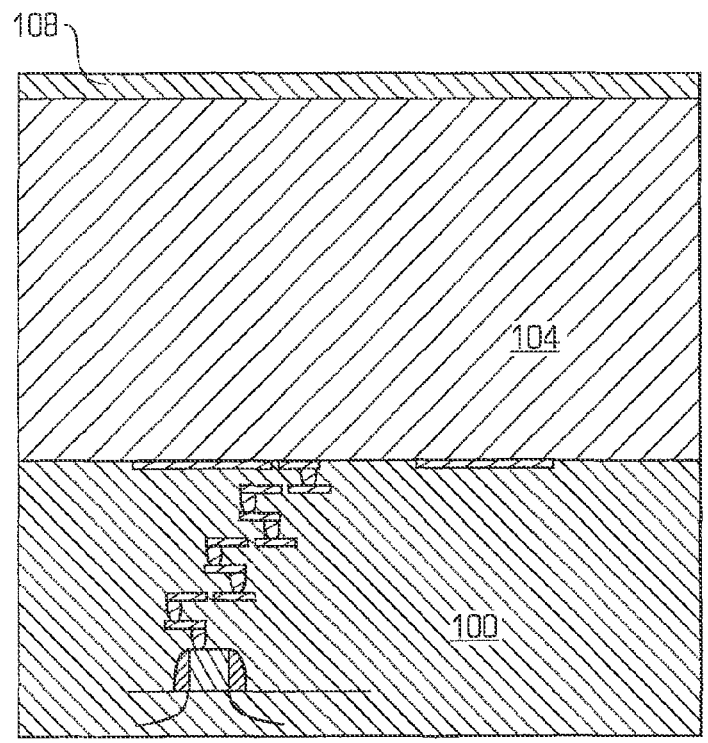
FIGS. 1A-1D are process diagrams illustrating an exemplary method of forming a semiconductor substrate consistent with the present invention.

FIGS. 1A-1D illustrate a method of forming an initial structure used to make circuit elements and ICs consistent with the present invention. The initial structure formed by this process includes a polymer layer with trench regions removed and having conductive elements, which may be shaped as fins, formed on the sidewalls of the trenches. Referring to FIG. 1A there is shown a cross sectional view of a semiconductor substrate 100 or other suitable substrate such as CMOS or bipolar with multi-layer of metal wire-interconnect, which may be of P type and is well known in the art. Further, as is well known, the substrate 100 may be a well. A first polymer layer of material 104 is formed (e.g. grown, deposited, etc.) on the substrate 100. For example, first layer 104 can be polyimide, which may be formed on the substrate 100 by any known process such as oxide deposition (e.g. chemical vapor deposition or CVD) to a thickness of about 3 to about 12 micrometers. According to some aspects, a hard mask etching process may be employed to etch the first polymer layer 104 (also referred to as the "first layer 104"). In these aspects, a hard mask layer 108, typically a dielectric such as a nitride or oxynitride, may be formed on the polymer layer 104 by any well know techniques such as deposition or nitridation/oxidation (e.g. CVD or plasma enhanced chemical vapor deposition PECVD) to a thickness of about 100 A to about 800 A.

Once the first polymer layer 104 and the hard mask layer 108 have been formed, a etching process is then used to etch the hard mask layer 108. In some aspects associated with the formation of inductive elements, a lithography process may also be used prior to the hard mask etch process. This lithography process includes application of a masking material (i.e. a photo resist or other lithographic material, on approximately the 0.18-1 micrometer scale) to the substrate 100 and exposure of the masking material to shape the hard mask 108 in connection with defining the inductor (wiring) elements, as explained below.

Figure 1B:
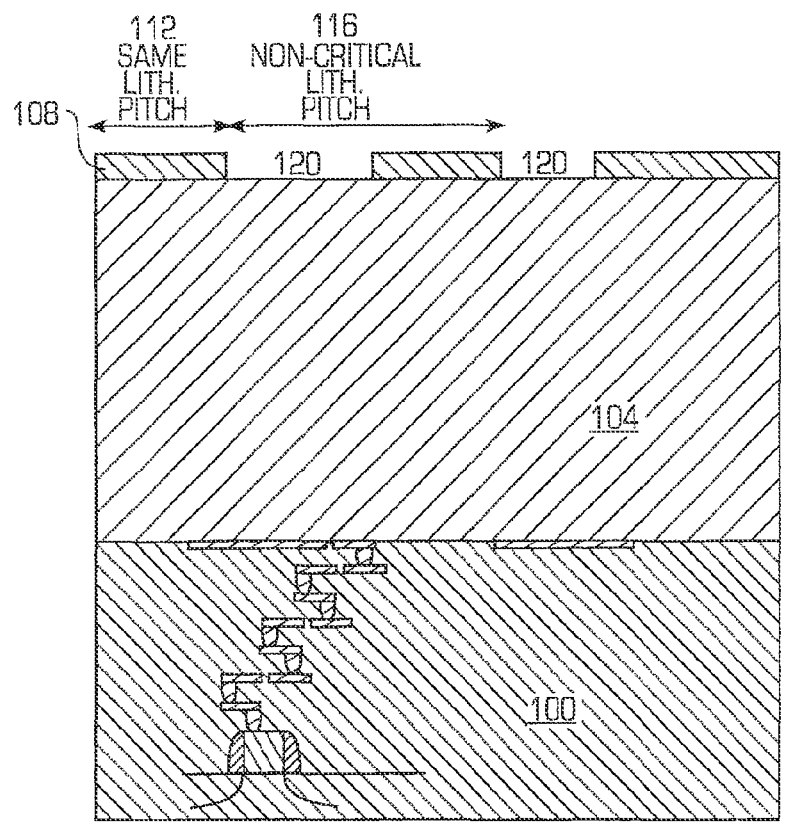
Figure 1C:
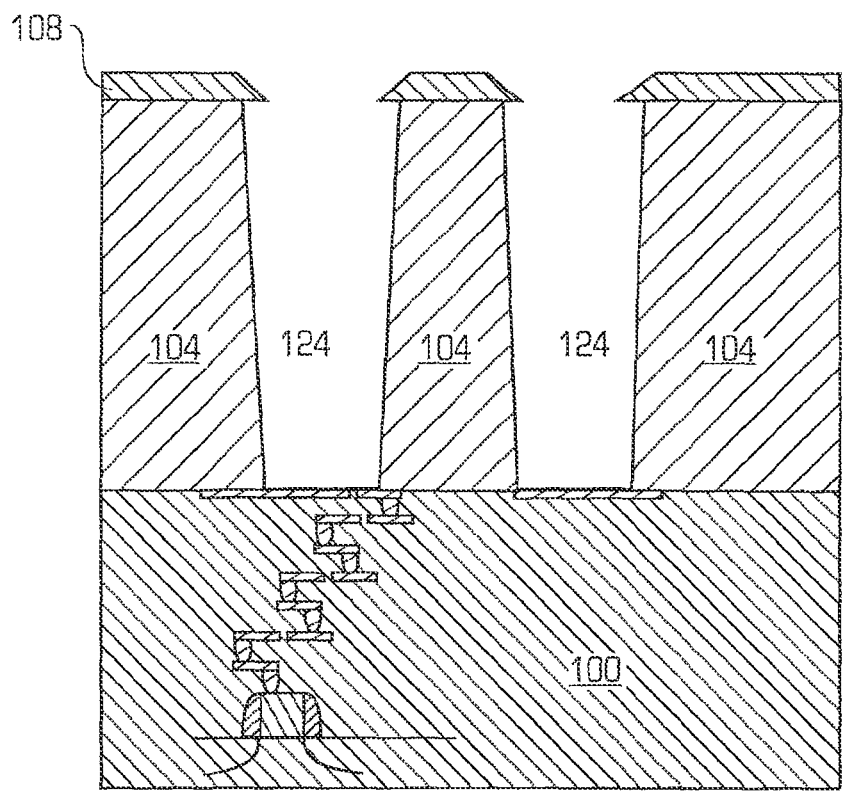

The hard mask etching process is then used to remove portions of the hard mask 108 thereby exposing underlying regions of the first polymer layer 104, as shown in FIG. 1B. This provides exposed regions 120 of the polymer layer 108 for further processing. The features, I.e. regions of hard mask layer 108 and exposed regions 120, may be of the same lithographic pitch 112 and/or of non-critical lithographic pitch 116. The areas of same lithographic pitch 112 are described in connection with aspects of insulation region formation described below ("isolation-related" aspects). The areas of non-critical lithographic pitch 116 generally relate to fabrication of inductive/passive circuit elements, as detailed below. Once the hard mask layer 108 has been etched to expose the desired regions 120 of the polymer layer 104, the masking material may then be removed.

Where the hard mask material 108 is removed, the exposed regions 120 of the first layer 104 are then etched by means of a reactive ion etch RIE process (e.g. a dry-development, oxygen-related, very-anisotropic RIE with a high DC bias) to form trenches 124 in the semiconductor structure. The resulting structure illustrated in FIG. 1C now defines regions of the first layer 104 interlaced with these trenches 124. One exemplary trench consistent with the same lithographic pitch of isolation-related aspects of the present invention may be about 0.3 to about 3 micrometers in width across the trench. The trenches 124 may form or define portions of passive elements (i.e. inductors, capacitors, etc.) and/or isolation-related structures consistent with various aspects of the present invention. In other aspects, as explained in more detail below, the trenches may be filled with conductive or semiconductive material to facilitate interconnection of various semiconductor elements.

Figure 1D:
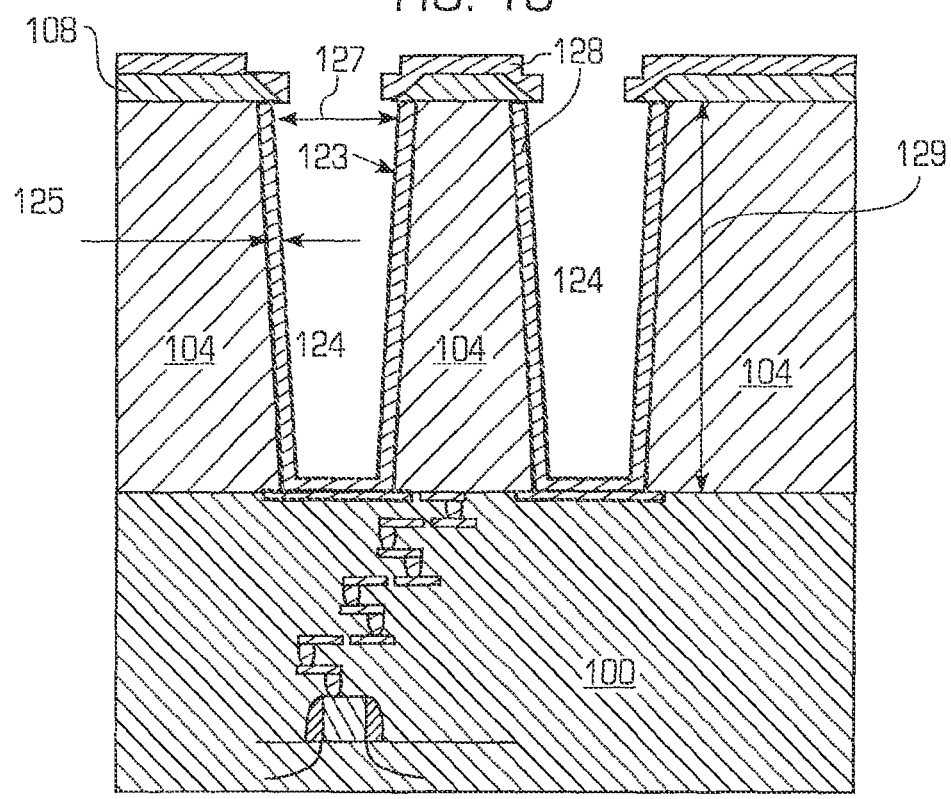

Metal regions such as metal layers 128 are then deposited over the structure, covering the portions of hard mask layer 108 that remain as well as portions of the substrate 100 and polymer layer 108 exposed at the bottom and on side walls of the trenches, respectively. Exemplary metal layers deposited within these trench regions 124 may include gold, copper, aluminum, and/or alloys of or conductive materials plated with gold, copper, and/or aluminum. The resulting structure is illustrated in FIG. 1D, which shows all of the exposed portions of the substrate covered with the metal layer 128. In one or more aspects described below, the metal layer portions on the sidewalls of the trenches may be used as inductive "fin" elements with sets of adjacent metal fins acting as "fin pairs." Opposed fin elements may be parallel with each other or merely "substantially parallel" defined as being within the realm of commonly accepted industrial deviation from parallel for the utility of the passive element they are forming, in question, including deviation selected to achieve desired electrical characteristics of the passive element. The deposited metal layer 128 may be relatively thin, as measured against similar metal layers from comparable passive/inductor elements known in the art. For example, the depth of the metal layer 128 deposited may be in the range of about 0.2 to about 1 micrometers for certain metals and fabrication processes such as one of standard metal wiring steps and about 1 to about 3 micrometer for other materials and processes such as thicker metal landing pad for wire bonding (e.g., exemplary ranges including about 0.2 um to about 3 um, about 0.3 um to about 3 um, among other ranges consistent with the materials and processes disclosed herein), as compared to a range of 3-7 micrometers known in the art. As this layer may be comprised of expensive metals such as gold or gold plating, the material cost for semiconductor articles consistent with the present invention is reduced significantly.

Base or Pad Region Formation

Figure 2A:
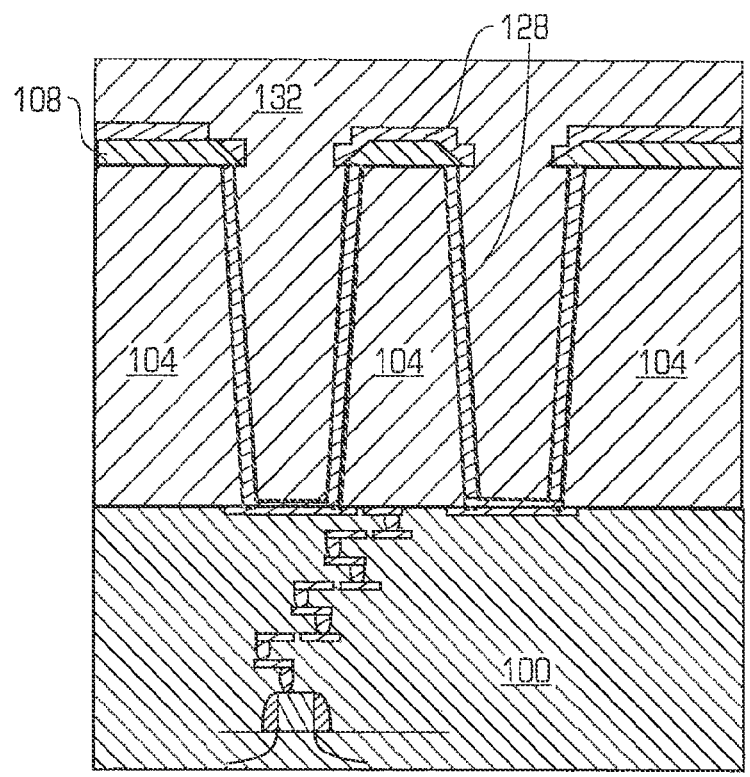
FIGS. 2A-2F are process diagrams illustrating an exemplary method of forming a passive element consistent with the present invention.

A "base" region may then be formed using the structure of FIG. 1D by covering or filling it with material particular to the application desired. An initial step for implementations including formation of this "base" region may include forming a second, relatively thick layer of polymer or dielectric material ("second layer" 132) over the structure. One exemplary range of thickness for this material would be about 10 to about 20 micrometers (um) in thickness. The second layer 132 may be formed by any known process suitable for providing the desired polymer or dielectric material (i.e. spin coating, baking, deposition, etc.). The resulting structure is illustrated in FIG. 2A. For certain applications, the surface of this second layer 132 may then be planarized or otherwise prepared for the desired application. For example, the surface may also be processed or treated to facilitate bonding or electrical connection with other elements of the semiconductor substrate and/or external components to be coupled with the semiconductor article.

Figure 2B:
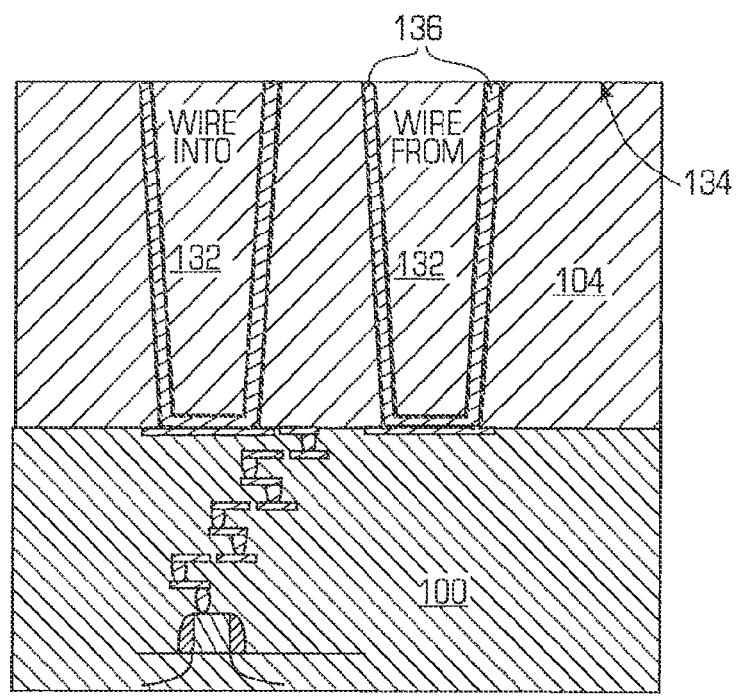

FIG. 2B illustrates an exemplary semiconductor structure after utilization of a planarization process to remove upper portions of the second layer 132. In this regard, the second layer 132 has been removed down to an upper plane 134 of the first polymer layer 104, which is used, e.g., as an end-point for the planarization process. Planarization to this point may be achieved by known methods, such as etch back or chemical mechanical planarization (CMP) processes, which may also enable clean-up of the various residue materials/metals. One or both of the second polymer layer 132 and the conductive fins 136 remaining on the sidewalls of the trench may form structural components of devices fabricated according to the present invention. For example, the second polymer layer 132 may be used as part of a conductive region to couple external elements into the substrate 100. According to one exemplary implementation, here, the second layer may be polyimide layer of about 10 to about 20 micrometers in thickness. Here, the material is planarized or etched back to form polyimide "plugs" within the trenches, as shown in FIG. 2B. In other non-limiting aspects, these polyimide plugs may be used as 'wire in' and/or 'wire out' conductors to electrically connect a device or element associated with the upper surface of the substrate structure.

Formation of Exemplary Inductive Elements

Figure 2C:
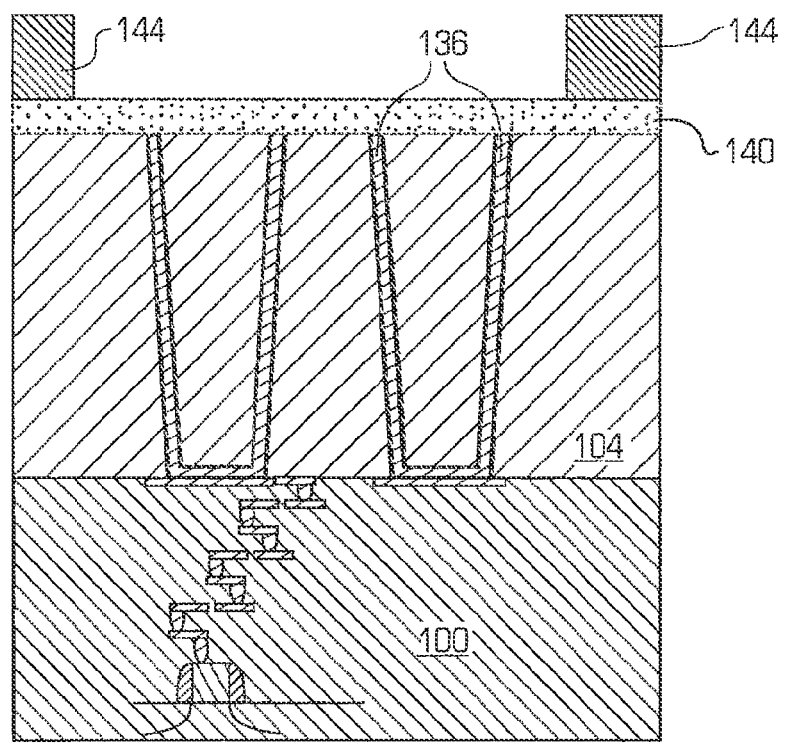
Figure 2D:
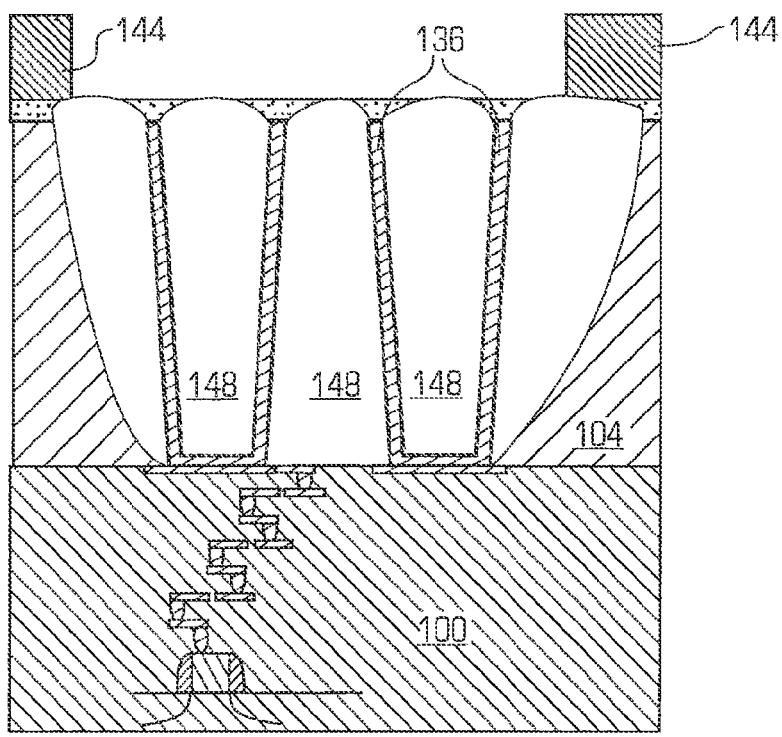
Figure 2E:
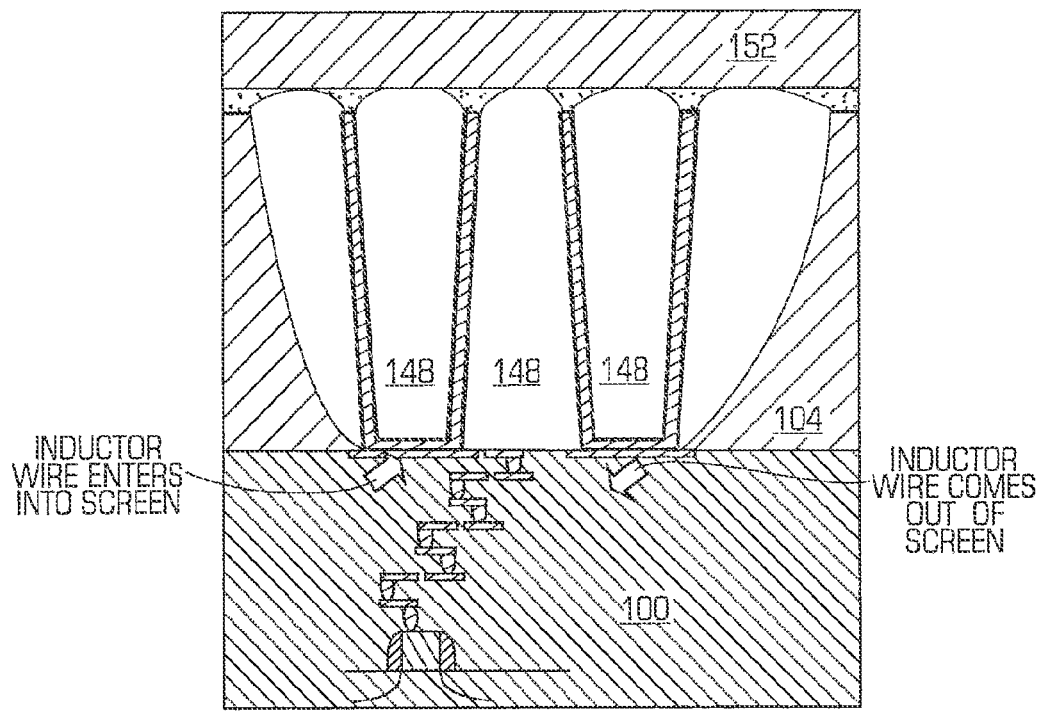

Applications consistent with the present invention may employ the fins 136 (or fin pairs, if formed as such) as the conductive traces for inductive elements. An illustrative process for fabricating one example of such an element is shown in FIGS. 2C-2E. In the exemplary sequence of FIGS. 2C-2E, the inductive element uses gas as the insulating material, although other types of insulating material are included within the scope of the present invention. For example, air may be used as an insulator to provide an air-bridge inductor, although examples of other suitable insulating materials include other gases and/or solid materials. Referring to FIG. 2C, a dielectric coating 140 of high porosity may be formed on the polymer layer 104 that has been planarized as set forth above. According to some exemplary aspects of the innovations herein, the dielectric coating may have a porosity greater than 50% and may be formed by any technique suitable to coating material desired, such as a spin-on or deposition process. Examples of such materials are Xerogel (e.g., $SiO_x$:$C_y$ repeating polymer network with porous holes), or participate (e.g., $SiO_x$ particles participate stacking with many voids) silica particles from an organic silicon polymer with oxygen polymer treatment.

Next, the structure and dielectric coating 140 may be subject to a masking process to provide hard mask portions 144 suitable for protecting the underlying regions of the polymer layer from a subsequent removal (i.e. etch) process. In the example illustrated in FIG. 2C, regions of the polymer layer 104 that are to act as inductive/insulating regions are left exposed for removal in the subsequent process.

FIG. 2D illustrates an exemplary structure as may result after removal of the polymer layer, which may be performed by appropriate dry-, wet-, and/or plasma-etch processes. This process removes the polymer layer 104 and the second layer 132 surrounding the metal fins 136 to create suitable regions for an inductor insulation medium, such as air bridge insulating areas 148. In this example, where the polymer/dielectric layer 104 is polyimide, this removal process may include an isotropic, chemical dry etch (CDE), oxygen-family plasma etch process. The etch constituents and process may perform simultaneous reactions or achieve simultaneous results, and also be tailored to the specific materials and desired inductor. For example, in the present air bridge inductor illustration, the exemplary dry etch may remove the polyimide to create air-bridge regions of higher inductance while also providing plasma oxidation of the exposed metal fins 136. Specifically, the above-described isotropic, oxygen-family dry etch may remove the polyimide while also leaving a protective layer (about 10 to about 30 Angstroms) of oxidation (i.e. $AlO_x$) on exposed aluminum fins 136. The masking material 144 may then be removed. The resulting structure is a plurality of fins (or pairs of fins) electrically connected to one or more transistors formed in the substrate.

Referring to FIG. 2E, another activation layer 152 may then be deposited over the metal-air-gap inductor element. According to some aspects of the innovations herein, this activation layer 152 may be used to electrically couple the inductor with surrounding substrate regions, such as to wiring lines/layers and/or other desired interconnects. For example, in the illustration described above, the activation layer 152 may be a polyimide layer used to connect the inductor to an appropriate wire-bonding region.

Figure 2F:
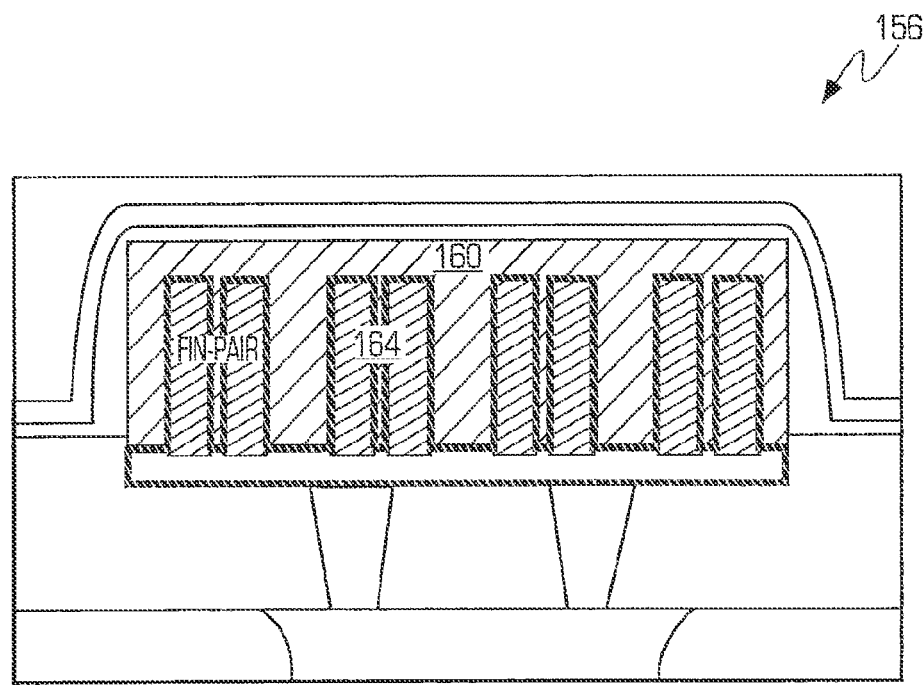

A structure resulting from the process set forth above is illustrated in FIG. 2F. The exemplary super inductor 156 of FIG. 2F may thus include an insulating material 160 comprised either of a polymer or of a gas such as air, and a series of fin pairs 164 for each inductor wire. In general, such inductor wires may be about 0.5 um to about 2 um in thickness, and the thicknesses of the other materials and layers regarding these aspects may also be generally consistent with those disclosed throughout (e.g., the dielectric or polymer mayer may be about 10 to about 20 um in thickness, etc.). In situations where a non-gas insulator is desired, the insulating material may be a low dielectric constant, low-magnetic-hysterisis-loss polymer. Regardless of whether the insulating material is an interlevel dielectric or a gas, specified quantities of inductor wires or fin pairs 164 will yield certain Q values. As a general rule, multiple fin pairs 164 will yield improved skin conductivity and thus better Q. For example, in the present illustration, four pairs of fins provides 8 times larger skin conductivity, with an improved Q associated therewith.

A variety of other advantages are also achieved, more generally, by the above-described inductors and fabrication processes. For example, use of fin pairs can double the effective surface area of the inductive element, thus doubling available skin current and improving operation in the radio frequency/gigahertz regimes. Further, use of multiple fin pairs multiplies the available surface area/skin current and enables further reduction of inductor resistance at such higher frequencies. With regard to the fabrication, the processes set forth above can provide an even taller aspect ratio than conventional inductors for the same lithographic pitch because, inter alia, this process no longer depends on thick metal etching limitations. These processes also afford larger etch manufacturing windows, such as with aluminum lift-off and RIE as well as copper damascene process, as a result of using a majority of processes that are consistent with or bear relation to mature/proven manufacturing processes.

Formation of Exemplary Capacitive Elements

Figure 3A:
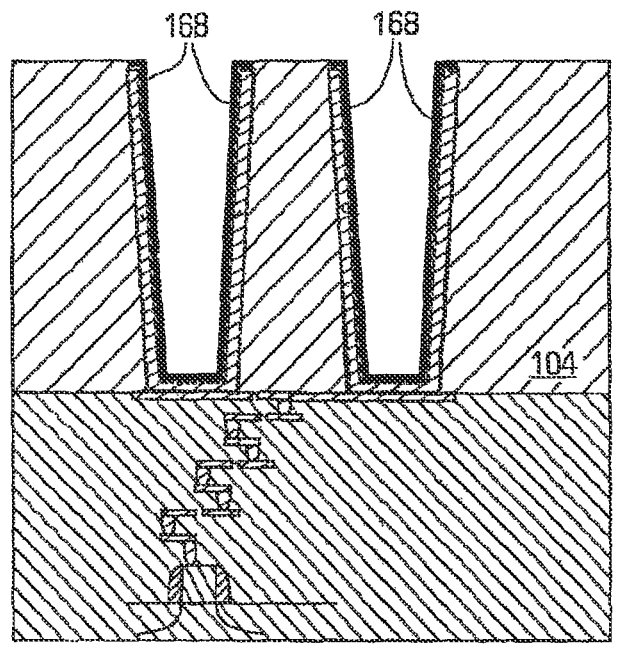
FIGS. 3A-3D are process diagrams illustrating an exemplary method of forming another passive element consistent with the present invention.
Figure 3B:
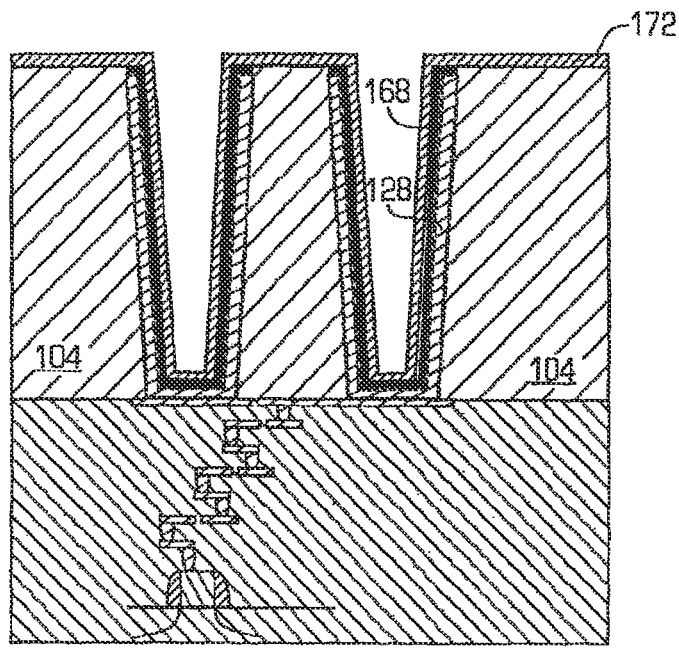
Figure 3C:
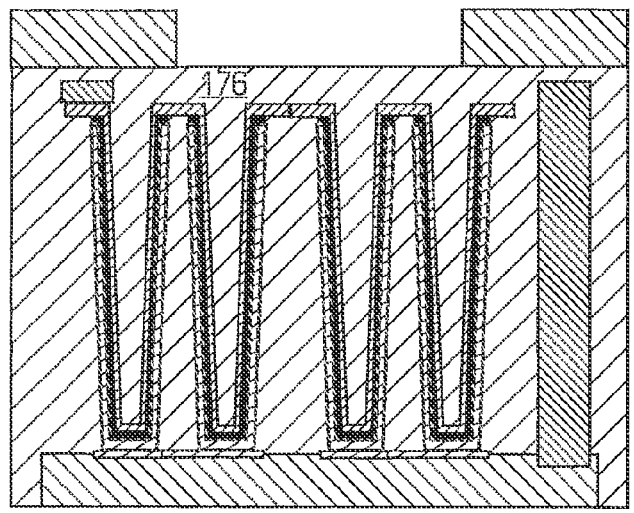

The basic structure of FIG. 1D, comprising fin-shaped structures of a metal layer 136 formed within trenches in the first polymer layer 104, may also be used to fabricate capacitive elements. FIG. 3A-3C illustrate one exemplary process used to fabricate a MIM capacitor consistent with the present invention. Here, the structure may initially be planarized using the first polymer layer 104 as an endpoint, similar to the planarization set forth in connection with FIG. 2B, above. Thus, a CMP process may be used to remove the hard mask and upper portion of the metal layer not within the trenches. The resulting structure includes a first polymer layer 104 as well as the fin portions of the metal region or layer 136 remaining within the trenches, as shown in FIG. 3A. As also shown in FIG. 3A, a high-k dielectric material 168 is then formed over the metal layer remaining within the trenches. Exemplary implementations may include a polymer layer of about 3 to about 12 micrometers in thickness, metal regions comprised of gold, aluminum and/or copper and including a layer of about 0.5 um to about 2 um in thickness, and dielectric material of about 10 to about 20 micrometers in thickness, among other dimensions consistent with the materials and processes disclosed herein. A variety of techniques may be used to form the desired high-k material, depending upon the material being formed, substrate particulars, and other parameters associated with the intended use, as known in the art. According to some aspects of the innovations herein, the exemplary high-k dielectric material is aluminum oxide ($Al_2O_3$), which may be formed as a dielectric layer of 50-1,000 Angstroms using a wet anodization process. Other exemplary high-k dielectric materials include $Ta_2O_5$ and $HfO_x$ (with x=1-2), which may be formed by chemical vapor deposition (CVD) or physical vapor deposition (PVD) processes, with anneal in non-oxygen family conditions. It should also be understood that many other known high-k dielectrics and associated processes are also included within the scope of the present invention, including but not limited to HfSiON and $Al_2O_3$.

Referring to FIG. 3B, a top electrode metallization layer 172 (also "top electrode") is then formed on top of the high-k dielectric material 168. In accordance with some exemplary conductive elements, the top electrode 172 may be an aluminum layer formed by any suitable means, such as Al(TiN) sputtering. Electrode layers of this nature may be formed with a greater than 1 micrometer pitch, may include protective or conductive coatings such as Copper (Cu-easy) plating, and may utilize electrical or electrodeless formation processes, as used in the printer circuit board (PCB) fabrication field. Finally, an upper isolation layer 176 is formed over the entire structure to embed the capacitor within appropriate packaging/insulative material. The resulting structure, shown in FIG. 3C, provides a capacitor with plates formed in a three-dimensional structure within the trenches, including opposing plates formed along the fin elements to provide a higher capacitance density. Further, the vertical, three-dimensional structure also enables the fabrication of thick electrodes for high conductance MIMs, which possess the further advantage of having a lower parasitic resistance. As a result of these structural and process-related advantages, capacitive devices of the present invention have capacitance densities approximately 3-10 times higher than that of aluminum or copper devices fabricated according to comparable BEOL(back end of the line)-compatible processing.

Figure 3D:
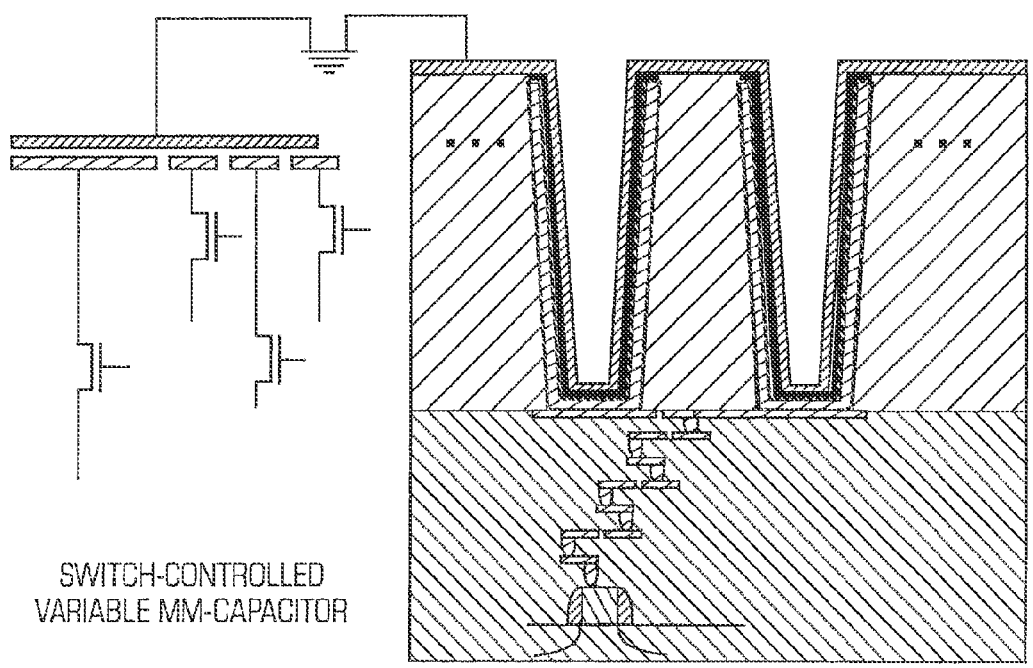

Accordingly, in one exemplary application, a MIM capacitor consistent with the present innovations may be used as a switch-controlled variable MIM capacitor. Referring to FIG. 3D, a system on a chip (SoC) implementing a plurality of such MIM capacitors is shown. FIG. 3D illustrates the packaging of several different MIM capacitors, each with very high capacitances, in a very small surface area. The associated "super MIM" capacitance quantities are much higher than the parasitic capacitances of comparable active switches. For example, super MIM capacitance quantities such as those similar to FIG. 3D, may have as much as or more than 10 times the capacitance vis-à-vis the junction capacitance of each switching MOSFET used to fine-tune precision capacitance(s).

Formation of Exemplary Resistive Elements

Existing techniques for forming resistive elements provide conductive elements (traces) that suffer from disadvantages similar to those of inductors and capacitors. For example, metal resistors designed for high resistance operation typically require overly long resistive traces that demand a larger surface area of the die. Thus there is a need for resistive traces of higher sheet resistance to yield smaller resistors, enabling a corresponding decrease in die area required. Solutions such as increasing the resistance by use of ultra-narrow or ultra-thin films are often insufficient, however, because they yield large tolerance variation(s). Accordingly, resistors of the present invention may be fabricated using additives to increase the resistivity of the conductive material. In some exemplary aspects, Titanium (Ti) or Tantalum (Ta) alloy resistors may be formed with increased resistivity by the addition of oxygen to the nitrogen plasma used to sputter the material onto the substrate. For example, the addition of approximately 0.1-5% oxygen to the nitrogen plasma may yield an increase in resistance in ranges as much as 50-200%. The resulting $TiN_xO_y$ or $TaN_xO_y$ compounds have a much higher sheet resistivity than conventional TiN or TaN resistors. In some exemplary $TiN_xO_y$ or $TaN_xO_y$ compounds of such resistors, x may be about 1 to about 2, and y may be about 0.1 to about 0.3, or about 0.01 to about 0.3, among other ranges consistent with the materials and processes disclosed herein. Other parameters for exemplary resistive elements comprised of a Titanium or Tantalum base metal material include use of a nitrodization/nitrodation compound including about 30 to about 60 percentage of nitrogen by weight of Titanium or Tantalum, and trace amounts of oxygen introduced into an ambient. Resistors may thus be formed with thicker and wider traces, enabling tighter tolerance control. Further, shorter winding length(s) are required, as a smaller resistor can be used to meet the same impedance need.

Figure 4A:
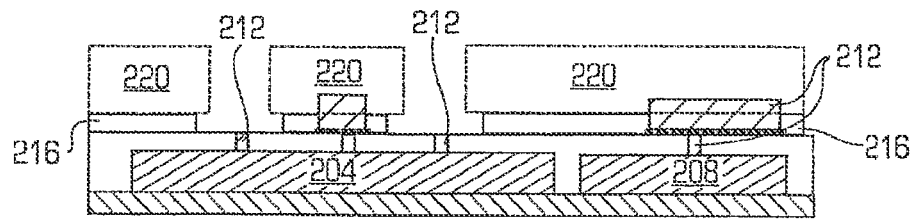
FIGS. 4A-4C are process diagrams illustrating an exemplary method of forming yet another passive element consistent with the present invention.
Figure 4B:
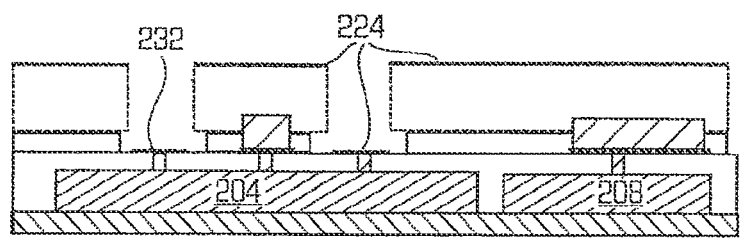
Figure 4C:
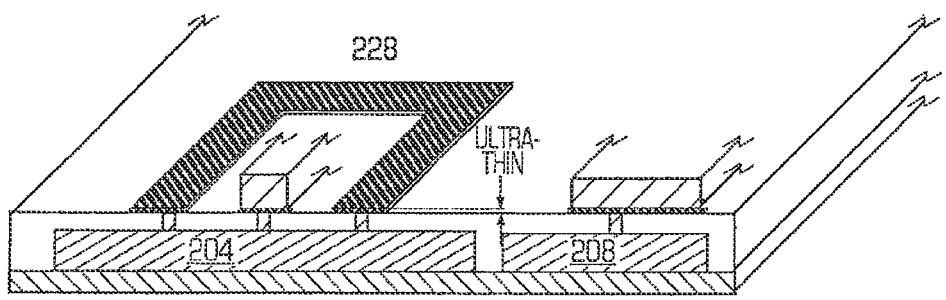

In another exemplary application illustrated in FIGS. 4A-4C, a metal resistor of the present invention may be formed using an ARC-undercut lift off process. Such a resistor is particularly advantageous for use in system on a chip (SoC), system in a package (SiP), and multi-chip module (MCM) applications. In the exemplary SiP/MCM article illustrated in FIGS. 4A-4C, a metal resistor 232 is shown packaged with a first element such as an active RF component 204 and a second element such as a digital CMOS component 208. Standard metal wiring 212 is provided to electrically couple the components to other elements in the package. An ARC film 216 is then formed on the structure to facilitate creation and placement of the resistor and/or other related elements in the package. A polymer layer 220 is then formed in regions above the ARC film 216, preferably in connection with an undercut ARC film to ensure no sidewall/bottom stringer link defects associated with a polymer layer strip. The polymer layer 220 may be polyimide or other polymer material, formed by any suitable technique such as spin coating process using photo-imaging lithography. Next, a very high resistance metal layer 224, consistent with the composition set forth above, is formed to create the resistor sheet material. For example, a $TiN_xO_y$ or $TaN_xO_y$ layer of about 50 to about 5,000 Angstroms may be formed in the desired regions by very-directional sputtering. Finally, the polymer layer 220 and ARC film 216 may be stripped using, for example, a wet removal process. The resulting structure is shown in FIG. 3C, which is a cross-sectional diagram that depicts the remaining resistor 228 in three-dimensional space for purposes of illustration only.

Exemplary fabrication processes such as this one provide precision width control of resistive elements using traditional lift-off and undercut ARC techniques. Moreover, such processes involve a photo-imaging technique for the polymer/resist layers using a mask that is much thinner than that of traditional lift-off techniques. This enables lithography of a tighter pitch and higher density devices.

System in a Package Applications

Figure 5:
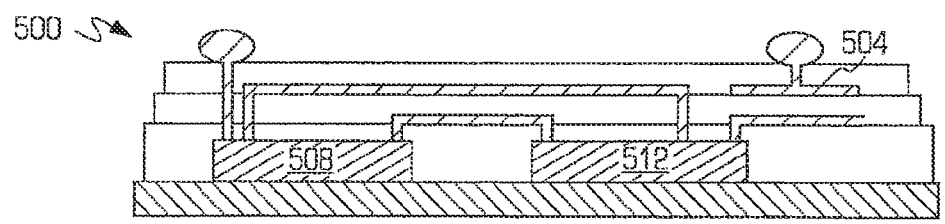
FIG. 5 illustrates an exemplary module or package consistent with certain aspects related to the present invention.

Passive components and processes consistent with the present invention, as set forth above, are suitable for a variety of applications at the package or module level. Referring to FIG. 5, a first exemplary MOM (multi-chip module) application is provided. FIG. 5 illustrates a multiple chip assembly including a first chip 508 such as an RF amplifier and a second chip 512 such as an RF switch interconnected within a module 500. In addition to basic circuit interconnects, a region of passive circuit components 504 is fabricated within the module to provide passive components required by or associated with the chips, such as matching circuits, capacitors, filters, etc. Advantages afforded by this application include very small form factor, multiple die, inductor/capacitors. This arrangement may also be used as a first step for various other radio frequency applications in the packaging field, such as RF-FEOL module, Blue-tooth, and/or other applications with similar requirements.

Figure 6:
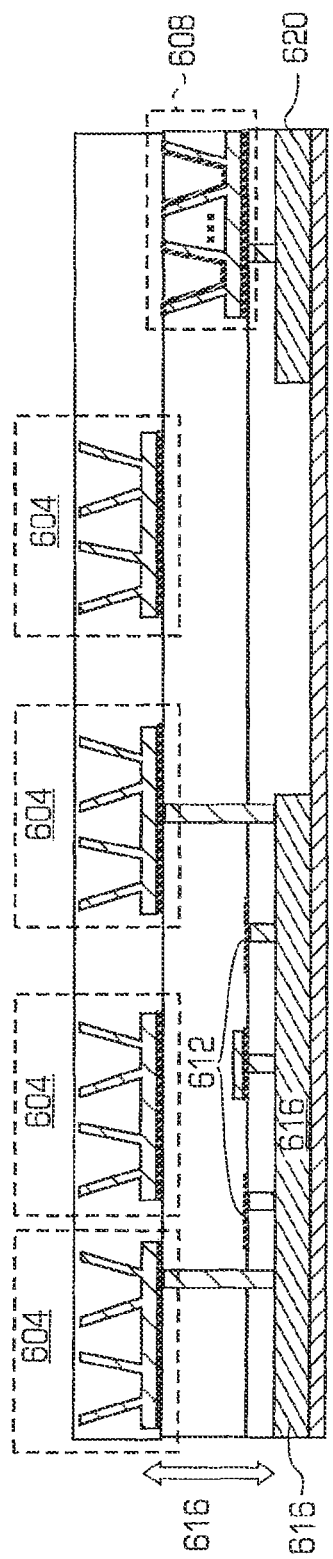
FIG. 6 illustrates another exemplary module or package consistent with certain aspects related to the present invention.

FIG. 6 illustrates another exemplary subsystem suitable for multi-chip modules (MCMs) and other advanced packaging technologies. These exemplary subsystems (packages or modules) are multi-component articles that include one or more of the passive elements described above, and may be manufactured by techniques disclosed in U.S. Patent Application Publication Nos. US2003/0122243A1 and US2003/0122246A1, which are both incorporated herein by reference in entirety. Such subsystems may also implement unitary passive elements for the LRC needs of multiple modules within the package. FIG. 6 is an exemplary subsystem 600 comprised of an active RF module 616 and a pure digital CMOS module 620. FIG. 6 illustrates a cross-section of the subsystem 600 including, inter alia, a passive, non-monolithic inductor 604, a passive MIM capacitor 608, and a metal resistor 612, each fabricated according to the present invention. Here, the inductor 604 is located far away from the RF module 616 (IC) so as to minimize substrate interference and self-resonant frequency problems. Specifically, in the subsystem of FIG. 6, a separation of about 5 to about 200 micrometers between the RF module 616 and the inductor 604 is used to achieve such isolation. Further, by combining passive elements, the packaging methods providing the subsystem 600 of FIG. 6 may avoid redundant costs of fabricating duplicative passive elements common to the various modules. In FIG. 6, for example, a more globalized set of passive LC-R components may be fabricated in one process, rather than forming some via the relevant Type III-V fabrication process and some via the relevant CMOS fabrication process. Finally, such subsystems may be fabricated using MCM-fab or the processes disclosed in the aforementioned U.S. patent application publications, which enables formation of better passive components due to the lower feature size (1 um or less) available with respect to non-silicon-wafer substrates.

Figure 7:
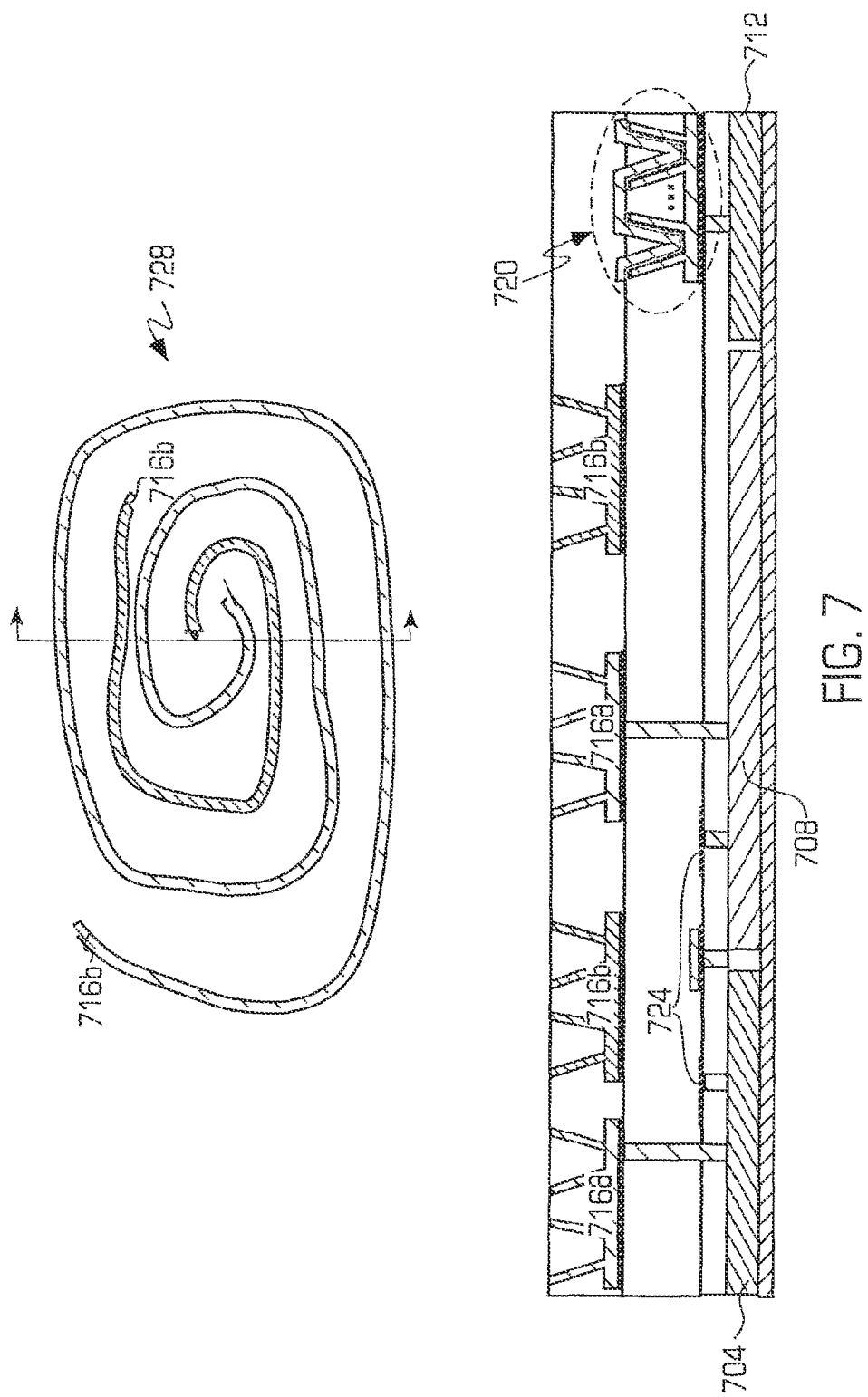
FIG. 7 illustrates top and side views of another exemplary module or package consistent with certain aspects related to the present invention.

FIG. 7 illustrates top and side views of another exemplary subsystem suitable for multi-chip modules (MCMs) and other advanced packaging technologies. The subsystem 700 of FIG. 7 is comprised of an active RF module 704, a high-voltage NAND or NOR flash memory module 708, and a high-voltage LCD driver module 712. Systems with high-voltage needs such as these may require transformers capable of handling high voltage and high current, as well as the inductors, capacitors, and resistors of the present invention, as set forth above. FIG. 7 illustrate an exemplary layout of inductive elements 716a and 716b, capacitors 720, and resistors 724, showing how coils 728 of the inductors 716a and 716b may be arranged for application as a transformer.

Figure 8A:
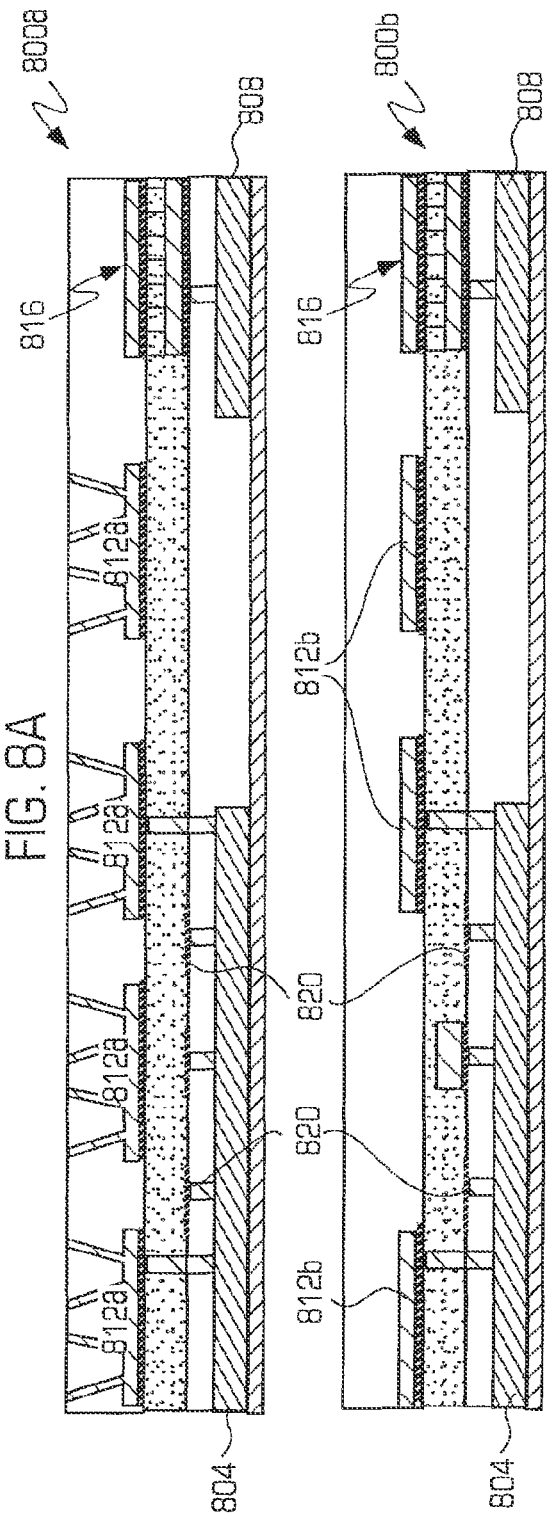
FIGS. 8A and 8B illustrate additional exemplary modules or packages consistent with certain aspects related to the present invention.
Figure 8B:
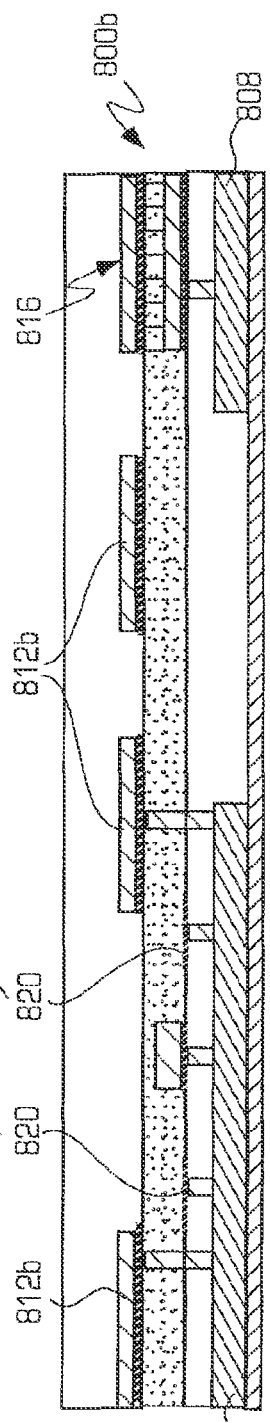

FIGS. 8A and 8B illustrate further exemplary subsystems suitable for multi-chip modules (MCMs) and other advanced packaging technologies. The subsystems 800a and 800b of FIGS. 8A and 8B are comprised of active RF modules 804 and pure digital CMOS modules 808. These exemplary subsystems are applicable to relatively large assemblies, i.e. assemblies comprised of more than just a few small chips (chips of less than 100 square millimeters in area). Fabrication of the subsystems of FIGS. 8A and 8B include, inter alia, conventional board probing, laser trim of the passive elements, and a plastic seal process, yielding the inductors 812, capacitors 816, and resistors 820 set forth herein. The exemplary passive components of FIGS. 8A and 8B include a "nature" capacitor 816 having top and bottom electrodes separated by inherent interlayer ILD material of an associated packaging process, which may also include a high dielectric constant material such as $Al_2O_3$, $Ta_2O_5$, $Ti_2O_5$ or $HfO_x$. The remaining passive components include resistors 820 and inductors 812, which may be fin-type inductors 812a or fin-less inductors 812b as shown in the figures. During fabrication, a laser trim process may be used to set/determine the resistor length or the capacitor length.

Other exemplary subsystems suitable for MCM/SiP applications are also included within the present invention. For example, various mobile telephone packages consistent with the present invention allow minimization of the form factor requirements and replacement of a traditional board with a substrate directed to the discrete passive capacitor, inductor and resistor elements required. Specifically, mobile phone packages are commonly characterized by a variety of different components, chips or ICs, each potentially made using very different fabrication processes. Thus, in a first example, a mobile phone package may include an active RF component, a flash component that may include a high-voltage charge pump (even a micro-transformer/inductor) or other high-voltage flash generator, and a baseband processor component. Accordingly, the conventional package board may be replaced with and LRC board containing the passive elements, fabricated consistent with the devices and methods set forth above. Thus, again, the three components or chips share the same common passive RLC structure.

Figure 9:
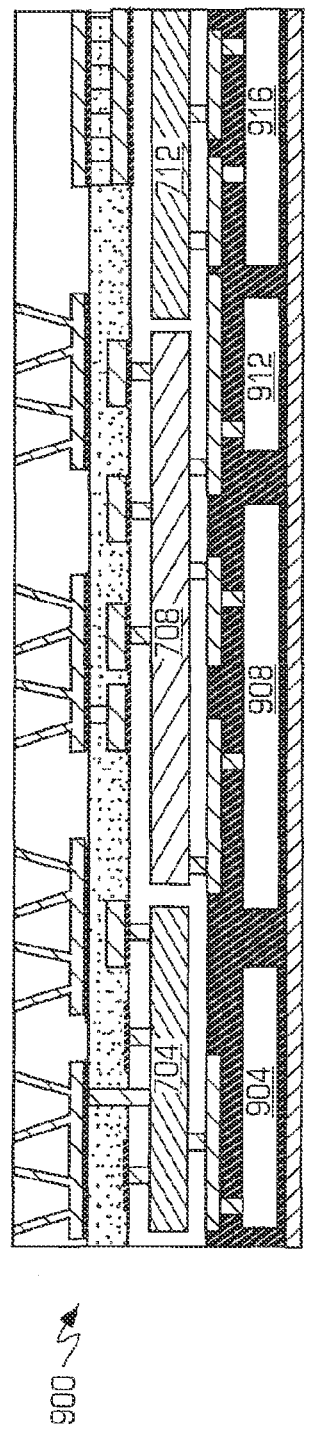
FIG. 9 illustrates another exemplary module or package consistent with certain aspects related to the present invention.

FIG. 9 illustrates another exemplary package 900 suitable for mobile phone applications. The package 900 of FIG. 9 may include components similar to those of FIG. 7, such as an active RF component, a SuperFlash/charge pump component, and a baseband processor component, as well as various other components manufactured by different processes. For example, the package may also include an OTP/FPGA or other custom component manufactured by, e.g., a 01.8 um process, a Pseudo-(DRAM)-Cache component manufactured by, e.g., a 0.1 um process, a processor component manufactured by, e.g., a 0.1 process, and/or a DSP component manufactured by, e.g., a 0.1 um process. As such, components from numerous different fabrication processes may be readily integrated into a single package. This exemplary implementation is also particularly suitable to loss-pitch MOM fabrication processes because this enables creation of the LC-R passive elements on preexisting dies.

Figure 10:
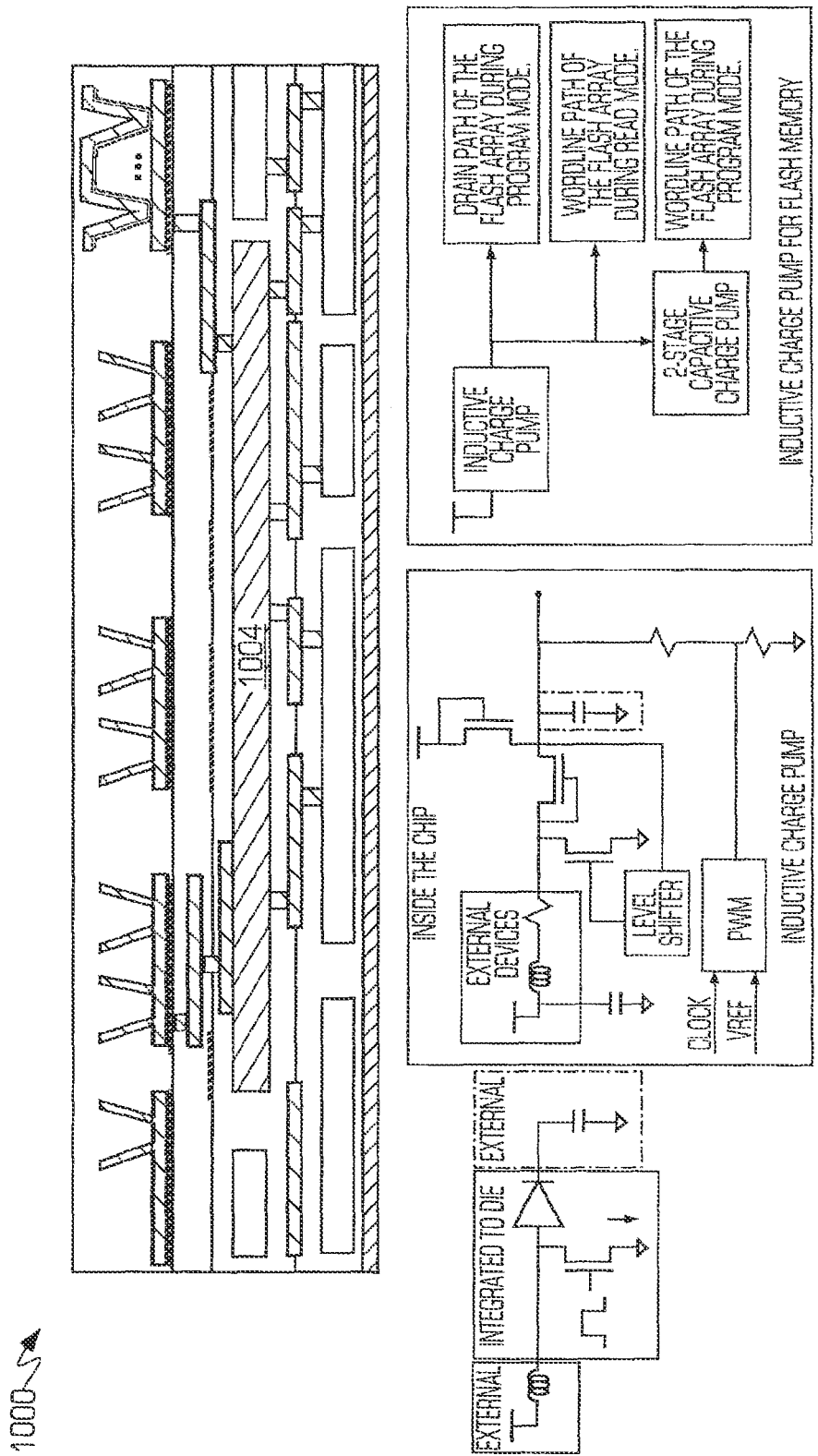
FIG. 10 illustrates another exemplary module or package consistent with certain aspects related to the present invention.

FIG. 10 illustrates another exemplary package 1000 similar to that of FIG. 9, though including a 64 Gb NAND/data (1 Gb/sec, extremely wide page) SuperFlash element as the Flash component. Package requirements for this component include a highly-parallel flash programming current, high voltages, source injection at lower than hot-electron level(s), and a higher instant current needs (i.e. than a NAND FN-programming/wide page Flash). The passive elements are again formed off-chip but, here, the passive article fabrication processes set forth above affords capabilities such as being in SiP (System in packages) charge pumps, enabling provision of inductors/capacitors via an off-die SiP charge pump, etc. Further, in this example, the inductors and capacitors may be shared with the RF dies, which allows the flash die to be smaller and provides for a high data transfer rate.

FIG. 11 illustrates another exemplary package 1100 showing implementation of aspects of the present invention to create of a powerful, passive transceiver for gigahertz electromagnetic energy applications. By use of the fabrication processes set forth above, a transceiver 1104 may be formed within a package at a very small form factor (0.1 mm in height). Due to these size and package integration features stated above, such transceivers 1104 are particularly useful in wireless devices, such as mobile phones, PDA, and other related mobile device data transmission fields. Again, both the high Henry, high Q inductor and the high Faraday, high Q capacitor are positioned far away from the IC's to avoid self resonant frequency problems. For example, in FIG. 11, the inductor/transceiver 1104 may be position a distance 1108 of about 5 to about 20 micrometers from the active RF component.

FIG. 12 illustrates another exemplary package 1200 showing implementation of aspects of the present invention to create a package containing a virtual battery 1204 powered by radio- or other-frequency electromagnetic energy. By use of the fabrication processes set forth above, a highly responsive inductive/capacitive device 1204 may be formed in a battery-less package at a very small form factor (i.e. RF ICs of less than 1 mm$^2$ features). Such inductive/capacitive devices 1204 are particularly useful in applications such as RF-ID (radio-frequency identification) where, e.g., a reader module may transmit energy to the package 1200 to gather information from components of the package or the package itself. Here again, the high Henry, high Q inductor and the high Faraday, high Q capacitor are positioned far away from the IC's to avoid self resonant frequency problems.

With regard to fabrication of these passive components for use in such packages, use of outdated or totally-retired fabrication equipment may be advantageously employed. Specifically, a 0.5 micrometer DRAM fab may be used to form discrete inductor devices for printed circuit (or other) boards, and/or other packages or substrates. Examples of other substrates suitable for these applications include 8-inch glass substrates, high-temperature plastic substrates, or silicon wafer substrates having thick (>5,000 Angstrom) oxidation. Fabrication equipment or facilities such as these may provide large BEOL foundry surfaces for creation of suitable inductive devices. An inductor fabricated at this feature size may have 8 or even more fins per wire turn. Further each such fin may also be of larger height relative to more modern fabrication equipment, providing additional available surface current per segment of fin area and turn. Finally, such inductors may be fabricated using 3 or fewer masking processes, with extremely high (~100%) yield and very low PE test issues. These benefits provide significant cost advantages over other processes that require numerous masks plus additional testing. Accordingly, processing consistent with these fabrication conditions and parameters yields devices with both high Henry and Q (energy efficiency).

According to another exemplary aspect, a retired DRAM fabrication system may be employed to fabricated surface mount discrete capacitors. Specifically, for example, a 10,000 die per piece DRAM can form, i.e. on thin-Glass or plastic substrates, much larger capacitor surfaces (with controllable roughness) per layer, as compared to conventional, fully flat capacitor fabrication, due to the ability to fabricate the capacitor plates in the vertical, fin-type arrangements set forth above.

Figure 13:
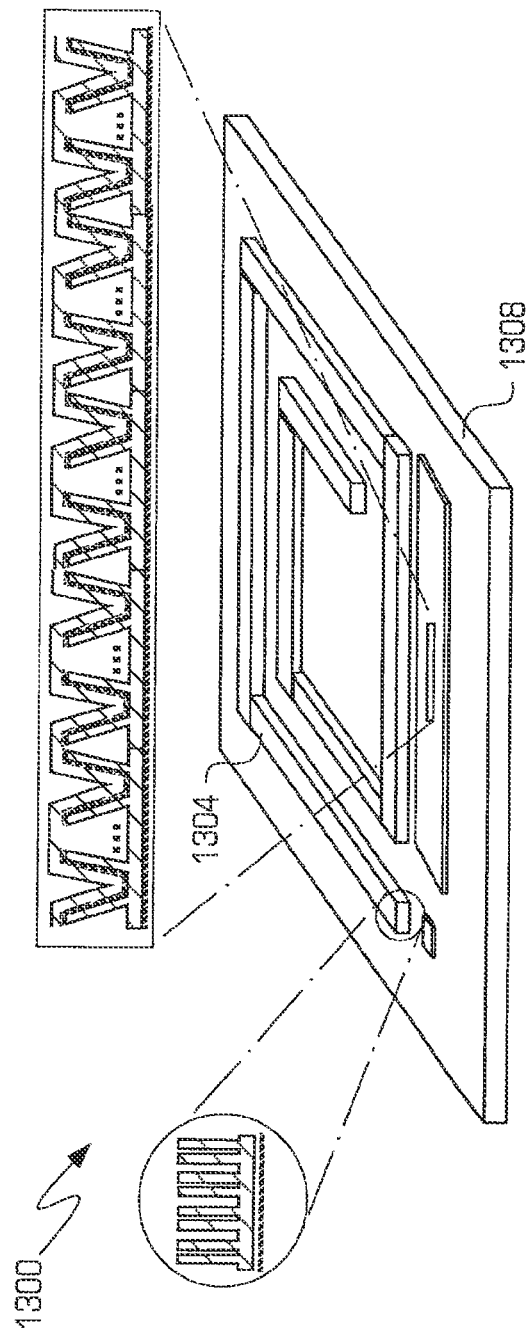
FIG. 13 is a perspective view illustrating another exemplary module or package consistent with certain aspects related to the present invention.

FIG. 13 illustrates another exemplary package 1300 showing implementation of aspects of the present invention to create a package containing a very large scale (on the order of cm$^2$) passive element 1304 for use as an antenna or rectanna. By use of the fabrication processes set forth above, a large scale passive element 1304, such as an inductor or capacitor, may be formed, for example, on a silicon or plastic substrate 1308. Advantages of these implementations include such things as fewer fabrication processes/layers (e.g. fabrication using only 1-3 layers of plastic), and lower fabrication complexity due to relatively larger form factor (e.g. 0.2-0.3 mm IC chips). Specifically, one suitable implementation may use 65 nm CMOS processing ($V_{dd}$=0.8 volts) to create a miniature-size, expansive silicon device. Moreover, articles containing such passive devices may be used in contact-less RF-ID applications, as well in contact-less smart-card or other applications having electromagnetic field creation and detection requirements of similar magnitude.

Figure 14:
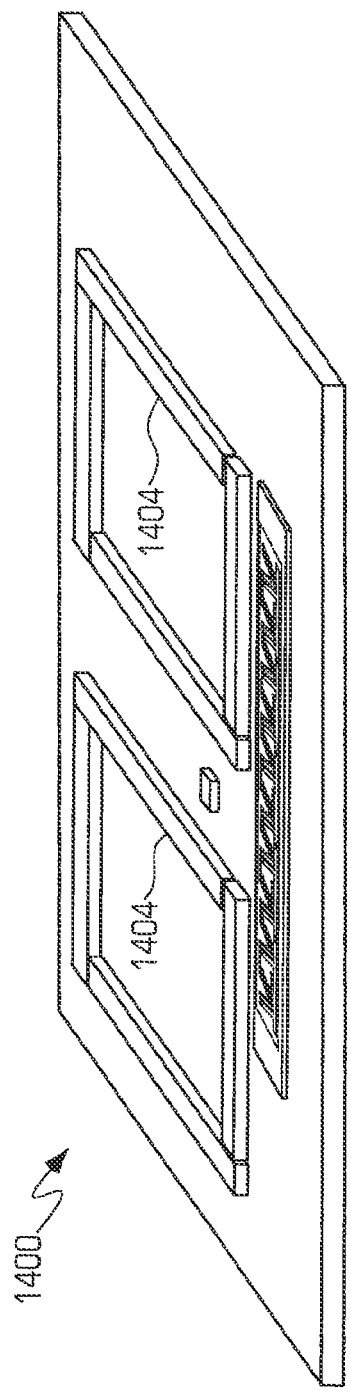
FIG. 14 is a perspective view illustrating another exemplary module or package consistent with certain aspects related to the present invention.

FIG. 14 illustrates another exemplary package 1400, which is related to the package 1300 of FIG. 13, showing implementation of aspects of the present innovations to create a package including multiple passive conducting elements 1404. For example, the multiple passive conductive elements 1404 may be inductors used to form very large scale antennas. In addition to the parameters and advantages set forth above in connection with FIG. 13, the multiple inductor elements 1404 of the present package 1400 afford further, three-dimensionally-enhanced surface area, enabling a corresponding increase in skin current.

It is to be understood that the foregoing description is intended to illustrate and not limit the scope of the invention, which is defined by the scope of the appended claims. Other aspects and embodiments are within the scope of the following claims.

The invention claimed is:

1. A method for manufacturing a semiconductor article, the method comprising:
   forming a first layer of dielectric/polymer material on a substrate;
   etching trenches within regions defining a passive element in the first layer;
   forming a metal layer on sidewalls of the trenches;
   forming a region of dielectric or polymer material over the substrate;
   forming areas of the metal layer formed on the sidewalls of the trenches such that planar strip portions of the areas form electrically conductive regions of the passive element that are aligned substantially perpendicularly with respect to a primary plane of the substrate; and
   defining the regions dedicated for the passive element, wherein the defining includes:
      performing a first mask process including formation of a first mask material on the first dielectric/polymer layer;
      etching regions of the first dielectric/polymer layer not protected by the first mask material to define regions for formation of the passive element;
      stripping the first masking material.

2. The method of claim 1 wherein the first mask process is a 0.18-1 micrometer process and the first mask material is a hard mask material.

3. The method of claim 1 wherein etching the first layer is performed by a process that includes a dry development hard mask.

4. The method of claim 1 wherein the region of dielectric of polymer material is a polyimide layer, and further comprising planarizing the polyimide layer down to the upper surface of the first dielectric/polymer layer, so as to fill the trenches with plug-shaped polyimide material that may be used to create contact regions for electrical connection to components above the substrate.

5. The method of claim 1 further comprising one or both of CMOS and/or Bipolar processes consistent with mix-signal application, whereby the passive element has a high self-resonant frequency and high Q.

6. The method of claim 1, wherein the first layer is about 3 to about 12 micrometers in thickness.

7. The method of claim 1, wherein the metal layer is comprised of gold, aluminum and/or copper, and is a layer of about 0.3 um to about 3 um in thickness.

8. The method of claim 1, wherein the region of dielectric or polymer material is a second dielectric/polymer layer of about 10 to about 20 micrometers in thickness.

9. The method of claim 1 further comprising:
   forming an inductive article using the regions defined for the passive element, the inductive article comprising a substrate defined by a primary plane, a first layer of dielectric/polymer material formed on the substrate, the first layer having trenches cut in a direction perpendicular to the primary plane, metal layers formed on the sidewalls of the trenches such that planar strip portions of the areas form electrically conductive regions of the inductive element that are aligned substantially perpendicularly with respect to the primary plane, and a region of dielectric or polymer material in the trenches, positioned between the metal layers on the sidewalls.

10. The method of claim 1 further comprising:
    forming an capacitive article using the regions defined for the passive element, the capacitive article comprising a substrate defined by a primary plane, a first layer of dielectric/polymer material formed on the substrate, the first layer having trenches cut in a direction substantially perpendicular to the primary plane, planar metal regions formed on the sidewalls of the trenches such that planar strip portions of the areas form electrically conductive regions of the capacitive element that are aligned substantially perpendicularly with respect to the primary plane, and a region of dielectric material in the trenches, positioned between the metal layers on the sidewalls.

11. The method of claim 1 further comprising:
    forming an resistive article using the regions defined for the passive element, the resistive article substantially comprised of a Titanium or Tantalum base metal material and a nitridation compound including about 30 to about 60 percentage of nitrogen by weight of Titanium or Tantalum, and trace amounts of oxygen introduced into an ambient.

12. The method of claim 2 further comprising:
    forming an inductive article using the regions defined for the passive element, the inductive article comprising a substrate defined by a primary plane, a first layer of dielectric/polymer material formed on the substrate, the first layer having trenches cut in a direction perpendicular to the primary plane, metal layers formed on the sidewalls of the trenches such that planar strip portions of the areas form electrically conductive regions of the inductive element that are aligned substantially perpendicularly with respect to the primary plane, and a region of dielectric or polymer material in the trenches, positioned between the metal layers on the sidewalls.

13. The method of claim 2 further comprising:
    forming an capacitive article using the regions defined for the passive element, the capacitive article comprising a substrate defined by a primary plane, a first layer of dielectric/polymer material formed on the substrate, the first layer having trenches cut in a direction substantially perpendicular to the primary plane, planar metal regions formed on the sidewalls of the trenches such that planar strip portions of the areas form electrically conductive regions of the capacitive element that are aligned substantially perpendicularly with respect to the primary plane, and a region of dielectric material in the trenches, positioned between the metal layers on the sidewalls.

14. The method of claim 2 further comprising:
    forming an resistive article using the regions defined for the passive element, the resistive article substantially comprised of a Titanium or Tantalum base metal material and a nitridation compound including about 30 to about 60 percentage of nitrogen by weight of Titanium or Tantalum, and trace amounts of oxygen introduced into an ambient.

15. A method for manufacturing a semiconductor article, the method comprising:
forming a first layer of dielectric/polymer material on a substrate;
etching trenches within regions defining a passive element in the first layer;
forming a metal layer on sidewalls of the trenches;
forming a region of dielectric or polymer material over the substrate; and
forming areas of the metal layer formed on the sidewalls of the trenches such that planar strip portions of the areas form electrically conductive regions of the passive element that are aligned substantially perpendicularly with respect to a primary plane of the substrate;
wherein etching the first layer is performed by a process that includes a dry development hard mask.

16. The method of claim 15, wherein the first layer is about 3 to about 12 micrometers in thickness.

17. The method of claim 15, wherein the metal layer is comprised of gold, aluminum and/or copper, and is a layer of about 0.3 um to about 3 um in thickness.

18. The method of claim 15, wherein the region of dielectric or polymer material is a second dielectric/polymer layer of about 10 to about 20 micrometers in thickness.

19. The method of claim 15 further comprising:
forming an inductive article using the regions defined for the passive element, the inductive article comprising a substrate defined by a primary plane, a first layer of dielectric/polymer material formed on the substrate, the first layer having trenches cut in a direction perpendicular to the primary plane, metal layers formed on the sidewalls of the trenches such that planar strip portions of the areas form electrically conductive regions of the inductive element that are aligned substantially perpendicularly with respect to the primary plane, and a region of dielectric or polymer material in the trenches, positioned between the metal layers on the sidewalls.

20. The method of claim 15 further comprising:
forming an capacitive article using the regions defined for the passive element, the capacitive article comprising a substrate defined by a primary plane, a first layer of dielectric/polymer material formed on the substrate, the first layer having trenches cut in a direction substantially perpendicular to the primary plane, planar metal regions formed on the sidewalls of the trenches such that planar strip portions of the areas form electrically conductive regions of the capacitive element that are aligned substantially perpendicularly with respect to the primary plane, and a region of dielectric material in the trenches, positioned between the metal layers on the sidewalls.

21. The method of claim 15 further comprising:
forming an resistive article using the regions defined for the passive element, the resistive article substantially comprised of a Titanium or Tantalum base metal material and a nitridation compound including about 30 to about 60 percentage of nitrogen by weight of Titanium or Tantalum, and trace amounts of oxygen introduced into an ambient.

22. A method for manufacturing a semiconductor article, the method comprising:
forming a first layer of dielectric/polymer material on a substrate;
etching trenches within regions defining a passive element in the first layer;
forming a metal layer on sidewalls of the trenches;
forming a region of dielectric or polymer material over the substrate; and
forming areas of the metal layer formed on the sidewalls of the trenches such that planar strip portions of the areas form electrically conductive regions of the passive element that are aligned substantially perpendicularly with respect to a primary plane of the substrate;
wherein the region of dielectric of polymer material is a polyimide layer, and further comprising planarizing the polyimide layer down to the upper surface of the first dielectric/polymer layer, so as to fill the trenches with plug-shaped polyimide material that may be used to create contact regions for electrical connection to components above the substrate.

23. The method of claim 22, further comprising opening the contact regions for use with wire bonding structures, wherein the contact regions form a landing pad for electrical connection with an external element.

24. The method of claim 22, wherein the first layer is about 3 to about 12 micrometers in thickness.

25. The method of claim 22, wherein the metal layer is comprised of gold, aluminum and/or copper, and is a layer of about 0.3 um to about 3 um in thickness.

26. The method of claim 22, wherein the region of dielectric or polymer material is a second dielectric/polymer layer of about 10 to about 20 micrometers in thickness.

27. The method of claim 22, further comprising:
forming an inductive article, the inductive article comprising a substrate defined by a primary plane, a first layer of dielectric/polymer material formed on the substrate, the first layer having trenches cut in a direction perpendicular to the primary plane, metal layers formed on the sidewalls of the trenches such that planar strip portions of the areas form electrically conductive regions of the inductive element that are aligned substantially perpendicularly with respect to the primary plane, and a region of dielectric or polymer material in the trenches, positioned between the metal layers on the sidewalls.

28. The method of claim 22, further comprising:
forming a capacitive article, the capacitive article comprising a substrate defined by a primary plane, a first layer of dielectric/polymer material formed on the substrate, the first layer having trenches cut in a direction substantially perpendicular to the primary plane, planar metal regions formed on the sidewalls of the trenches such that planar strip portions of the areas form electrically conductive regions of the capacitive element that are aligned substantially perpendicularly with respect to the primary plane, and a region of dielectric material in the trenches, positioned between the metal layers on the sidewalls.

29. The method of claim 22 further comprising:
forming an resistive article using the regions defined for the passive element, the resistive article substantially comprised of a Titanium or Tantalum base metal material and a nitridation compound including about 30 to about 60 percentage of nitrogen by weight of Titanium or Tantalum, and trace amounts of oxygen introduced into an ambient.

30. The method of claim 23 further comprising:
forming an inductive article using the regions defined for the passive element, the inductive article comprising a substrate defined by a primary plane, a first layer of dielectric/polymer material formed on the substrate, the first layer having trenches cut in a direction perpendicular to the primary plane, metal layers formed on the sidewalls of the trenches such that planar strip portions of the areas form electrically conductive regions of the inductive element that are aligned substantially perpendicularly with respect to the primary plane, and a region of dielectric or polymer material in the trenches, positioned between the metal layers on the sidewalls.

31. The method of claim 23 further comprising:
forming an capacitive article using the regions defined for the passive element, the capacitive article comprising a substrate defined by a primary plane, a first layer of dielectric/polymer material formed on the substrate, the first layer having trenches cut in a direction substantially perpendicular to the primary plane, planar metal regions formed on the sidewalls of the trenches such that planar strip portions of the areas form electrically conductive regions of the capacitive element that are aligned substantially perpendicularly with respect to the primary plane, and a region of dielectric material in the trenches, positioned between the metal layers on the sidewalls.

32. The method of claim 23 further comprising:
forming an resistive article using the regions defined for the passive element, the resistive article substantially comprised of a Titanium or Tantalum base metal material and a nitridation compound including about 30 to about 60 percentage of nitrogen by weight of Titanium or Tantalum, and trace amounts of oxygen introduced into an ambient.

33. A method for manufacturing a semiconductor article, the method comprising:
forming a first layer of dielectric/polymer material on a substrate;
etching trenches within regions defining a passive element in the first layer;
forming a metal layer on sidewalls of the trenches;
forming a region of dielectric or polymer material over the substrate;
forming areas of the metal layer formed on the sidewalls of the trenches such that planar strip portions of the areas form electrically conductive regions of the passive element that are aligned substantially perpendicularly with respect to a primary plane of the substrate; and
performing one or both of CMOS and/or Bipolar processes consistent with mix-signal application, whereby the passive element has a high self-resonant frequency and high Q.

34. The method of claim 33, wherein the first layer is about 3 to about 12 micrometers in thickness.

35. The method of claim 33, wherein the metal layer is comprised of gold, aluminum and/or copper, and is a layer of about 0.3 um to about 3 um in thickness.

36. The method of claim 33, wherein the region of dielectric or polymer material is a second dielectric/polymer layer of about 10 to about 20 micrometers in thickness.

37. The method of claims 1, 2, 15, 22, 23, 33, 3, 5, 6, 7, 16, 17, 24, 25, 34, or 35, wherein the region of dielectric or polymer material is a dielectric comprising a gas.

38. The method of claim 37, wherein the gas includes air.

39. The method of claim 33, further comprising:
forming an inductive article, the inductive article comprising a substrate defined by a primary plane, a first layer of dielectric/polymer material formed on the substrate, the first layer having trenches cut in a direction perpendicular to the primary plane, metal layers formed on the sidewalls of the trenches such that planar strip portions of the areas form electrically conductive regions of the inductive element that are aligned substantially perpendicularly with respect to the primary plane, and a region of dielectric or polymer material in the trenches, positioned between the metal layers on the sidewalls.

40. The method of claim 33, further comprising:
forming an capacitive article, the capacitive article comprising a substrate defined by a primary plane, a first layer of dielectric/polymer material formed on the substrate, the first layer having trenches cut in a direction substantially perpendicular to the primary plane, planar metal regions formed on the sidewalls of the trenches such that planar strip portions of the areas form electrically conductive regions of the capacitive element that are aligned substantially perpendicularly with respect to the primary plane, and a region of dielectric material in the trenches, positioned between the metal layers on the sidewalls.

41. The method of claim 33 further comprising:
forming an resistive article using the regions defined for the passive element, the resistive article substantially comprised of a Titanium or Tantalum base metal material and a nitridation compound including about 30 to about 60 percentage of nitrogen by weight of Titanium or Tantalum, and trace amounts of oxygen introduced into an ambient.

42. The method of claims 9, 10, 11, 12, 13, 14, 19, 20, 21, 27, 28, 29, 30, 31, 32, 39, 40 or 41, wherein the region of dielectric or polymer material is a dielectric comprising a gas.

43. The method of claim 42, wherein the gas includes air.

44. A method of making a Titanium- or Tantalum-based resistor comprising:
sputtering Titanium or Tantalum in a Nitrogen plasma to form an ambient; and
adding a low concentration of oxygen into the ambient.

45. The method of claim 44, wherein the resistor made by the process substantially comprises $TiN_xO_y$, where x is about 1 to about 2, and y is about 0.1 to about 0.3.

46. The method of claim 44, wherein the resistor made by the process substantially comprises $TaN_xO_y$, where x is about 1 to about 2, and y is about 0.1 to about 0.3.

* * * * *